(12) United States Patent
Naniwada (10) Patent No.: US 7,517,711 B2
(45) Date of Patent: Apr. 14, 2009

(54) MEMS TYPE RESONATOR, PROCESS FOR FABRICATING THE SAME AND COMMUNICATION UNIT

(75) Inventor: Koji Naniwada, Kanagawa (JP)

(73) Assignee: Sony Corporation, Tokyo (JP)

( * ) Notice: Subject to any disclaimer, the term of this patent is extended or adjusted under 35 U.S.C. 154(b) by 242 days.

(21) Appl. No.: 10/565,222

(22) PCT Filed: Jul. 21, 2004

(86) PCT No.: PCT/JP2004/010684

§ 371 (c)(1),
(2), (4) Date: Jan. 20, 2006

(87) PCT Pub. No.: WO2005/011116

PCT Pub. Date: Mar. 2, 2005

(65) Prior Publication Data

US 2006/0181368 A1    Aug. 17, 2006

(30) Foreign Application Priority Data

Jul. 25, 2003    (JP)    ............................. 2003-201967

(51) Int. Cl.
*H01L 21/02*    (2006.01)
*H03H 9/00*    (2006.01)
(52) U.S. Cl. ........................................... 438/50
(58) Field of Classification Search ................. 333/186, 333/197; 310/309
See application file for complete search history.

(56) References Cited

U.S. PATENT DOCUMENTS

| | | | |
|---|---|---|---|
| 6,249,073 B1 * | 6/2001 | Nguyen et al. | 310/309 |
| 6,437,965 B1 | 8/2002 | Adkins et al. | |
| 6,566,786 B2 * | 5/2003 | Nguyen | 310/309 |
| 6,808,954 B2 * | 10/2004 | Ma et al. | 438/51 |
| 2003/0168929 A1 * | 9/2003 | Ma et al. | 310/309 |

FOREIGN PATENT DOCUMENTS

| | | |
|---|---|---|
| JP | 51-81588 | 7/1976 |
| JP | 2002-535865 | 10/2002 |
| WO | 00/42705 | 7/2000 |

OTHER PUBLICATIONS

European Search Report dated Mah 18, 2007.

* cited by examiner

*Primary Examiner*—Benny Lee
*Assistant Examiner*—Alan Wong
(74) *Attorney, Agent, or Firm*—Sonnenschein Nath & Rosenthal LLP

(57) ABSTRACT

A MEMS resonator and a method for manufacturing thereof are provided, in which an adsorption of a beam into a substrate in a wet process when manufacturing a MEMS is prevented and other oscillation modes, which are unnecessary, than a required oscillation mode are not mixed at the time of operation. Further, a communication apparatus including a filter that has the MEMS resonator is provided. The MEMS resonator includes a substrate in which a lower electrode is formed and a beam formed on the substrate, in which at least one support column is provided between the substrate and the beam. As a filter, the communication apparatus includes a filter of the above MEMS resonator.

1 Claim, 11 Drawing Sheets

MEMS TYPE RESONATOR, PROCESS FOR FABRICATING THE SAME AND COMMUNICATION UNIT

TECHNICAL FIELD

The present invention relates to a MEMS resonator, a method for manufacturing thereof and a communication apparatus.

BACKGROUND ART

In recent years, attention has been paid to a micro-machine (MEMS: Micro Electro Mechanical Systems) element and a small device in which a MEMS element is incorporated. A basic characteristic of the MEMS element is that a driving body included as a mechanical structure is incorporated into a part of the element, and the driving body is driven electrically by an application of inter-electrodes coulomb's force and the like.

Since a micro-oscillation element formed by using a micro-machining technology based on a semiconductor process has such advantages that an area occupied by a device is small, a high Q-value can be obtained, and an integration with another semiconductor device is possible, a use as an intermediate frequency (IF) filter and a high frequency (RF) filter among wireless communication devices has been proposed by research laboratories including Michigan University (refer to Non-patent Reference 1).

Figure 15:
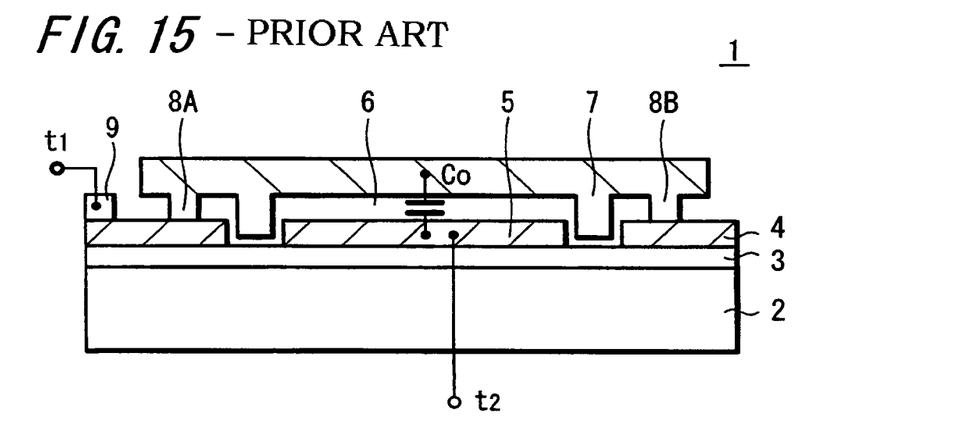
FIG. 15 is a constitutional diagram of a conventional MEMS resonator.

FIG. 15 shows a schematic view of an oscillator, specifically a MEMS oscillator, constituting a high frequency filter described in Non-patent reference 1. This oscillation element 1 includes: an input-side wiring layer 4 and an output electrode 5 which are, for example, made of polycrystalline silicon, formed on a semiconductor substrate 2 through an insulation film 3, and a beam capable of oscillating made of polycrystalline silicon, for example, that is called a beam-type oscillation electrode 7 formed to face the output electrode 5 separated by a space 6. The oscillation electrode 7 straddles the output electrode 5 like a bridge and is connected to the input-side wiring layer 4 such that this beam is supported by anchor portions (support portions) 8 [8A, 8B] at the both ends. The oscillation electrode 7 becomes an input electrode. A gold (Au) film 9, for example, is formed at an end portion of the input-side wiring layer 4. In this oscillator 1, an input terminal t1 is led out from the gold (Au) film 9 of the input-side wiring layer 4 and an output terminal t2 is led out from the output electrode 5.

In this oscillator 1, a high frequency signal S1 is supplied to the oscillation electrode 7 through the input terminal t1 in a state where a DC bias voltage V1 is applied between the oscillation electrode 7 and the ground. Specifically, an input signal in which the DC bias voltage V1 and high frequency signal S1 are superimposed is supplied from the input terminal t1. When the high frequency signal S1 of an objective frequency is input, the oscillation electrode 7 having a natural oscillation frequency determined by a length L oscillates by electromagnetic power generated between the output electrode 5 and the oscillation electrode 7. With this oscillation, a high frequency signal corresponding to temporal change of capacitance between the output electrode 5 and the oscillation electrode 7 and the DC bias voltage is output from the output electrode 5 (therefore, from the output terminal t2). A signal corresponding to the natural oscillation frequency (resonant frequency) of the oscillation electrode 7 is output in a high frequency filter.

A resonant frequency of a micro-oscillator which has been proposed and examined does not exceed 200 MHz at maximum, and a high Q-value that is a characteristic of a micro-oscillator has not been provided in a GHz band frequency region with respect to a conventional filter of a GHz region based on a surface acoustic wave (SAW) or thin film acoustic wave (FBAR).

At present, typically there is such tendency that a resonance peak as an output signal becomes small in a high frequency region, and it is necessary to improve an S/N ratio of the resonance peak in order to obtain an excellent filter characteristic. In a disk-type oscillator according to a literature of Michigan University, a noise component of an output signal depends on a signal to be directly transmitted through parasitic capacitance C0 generated between the oscillation electrode 7 that becomes an input electrode and the output electrode 5. On the other hand, since a DC bias voltage exceeding 30V is necessary in order to obtain a sufficient output signal in the disk-type oscillator, a type of a beam structure using a both-ends-supported beam is desirable as a practical structure of the oscillation electrode.

However, in the case of the above-described oscillation element 1 of FIG. 15, since the space 6 between the oscillation electrode 7 and the output electrode 5 is small and facing areas of both electrodes 7 and 5 have a required size, the parasitic capacitance C0 between the oscillation electrode 7 that becomes the input electrode and the output electrode 5 becomes large. Accordingly, a ratio Z0/Zx of impedance Z0 of the parasitic capacitance C0 to impedance Zx of a resonance system (resistance Rx, inductance Lx, capacitance Cx) becomes small, so that the S/N ratio of the output signal becomes small. There is such a dilemma that the parasitic capacitance C0 becomes larger when it is attempted to make the output signal larger by making the space 6 between the oscillation electrode 7 and the output electrode 5 small.

[Non-patent Reference 1] C. T. —Nguyen, "Micromechanical components for miniaturized low-power communications (invited plenary)", proceedings, 1999 IEEE MTT-S International Microwave Symposium RF MEMS Workshop, Jun. 18, 1999, pp, 48-77.

Figure 14:
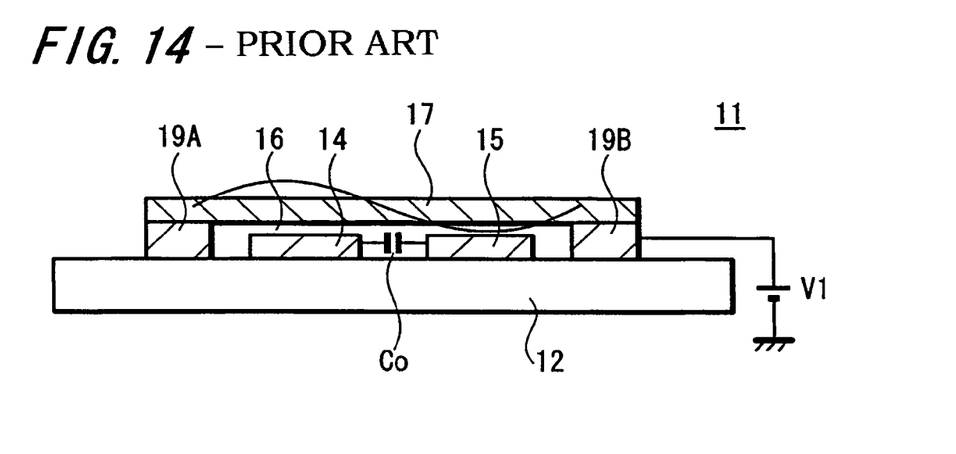
FIG. 14 is a constitutional diagram of a MEMS resonator according to prior art.

On the other hand, the applicants of the present invention have previously proposed a MEMS resonator aiming at a reduction of noise component in Japanese Patent Application No. 2003-11648. FIG. 14 shows a schematic view of the MEMS resonator. Basically, an oscillation electrode that becomes a beam to which a DC bias voltage is applied is disposed between input and output electrodes in order to reduce a noise component. As shown in FIG. 14, this MEMS resonator 11 includes: an input electrode 14 to input a high frequency signal and an output electrode 15 to output a high frequency signal formed at a required interval on a silicon semiconductor substrate 12 that has an insulation film on a surface, for example, and a beam, specifically an oscillation electrode 17, disposed to face those input and output electrodes 14 and 15 separated by space 16. The oscillation electrode 17 straddles the input and output electrodes 14 and 15 like a bridge and is integrally supported by support portions (what is called anchor portions) 19 [19A, 19B] at both ends to be connected to a wiring layer disposed outside the input and output electrodes 14 and 15.

In this MEMS resonator 11, a required DC bias voltage V1 is applied to the oscillation electrode 17, and a high frequency signal S1 is input into the input electrode 14. When a high frequency signal of an objective frequency is input, the oscillation electrode 17 resonates in a second-order oscillation mode by electromagnetic power generated between the oscillation electrode 17 and the input electrode 14 as shown in FIG. 14, for example. Since facing areas of the input and output electrodes 14 and 15 can be made small and an interval between the input and output electrodes 14 and 15 can be made large, parasitic capacitance C0 between the input and output electrodes 14 and 15 can be made small. Further, in order to obtain a large output signal, a distance of the space 16 between the oscillation electrode 17 and the input and output electrodes 14 and 15 can be reduced. Accordingly, a noise component of an output signal can be reduced in comparison to FIG. 15, and an S/N ratio can be improved.

Hereupon, when the space 16 between the oscillation electrode 17 and the input and output electrodes 14 and 15 is made smaller in order to obtain further larger output signal in the MEMS resonator 11 of FIG. 14, there is a possibility that the oscillation electrode 17 is adsorbed into the substrate 12 in a wet process during a manufacturing process, particularly in a process of removing a sacrifice layer. In addition, when applying to multi-order oscillation modes, it is difficult to select an oscillation mode of a desired order-number. Specifically, there is a possibility that the multi-order oscillation modes exists in a mixed manner.

DISCLOSURE OF THE INVENTION

In view of the above, the present invention provides a MEMS resonator and method for manufacturing thereof, in which an adsorption of a beam into a substrate is prevented in a wet process during a MEMS manufacturing process, and there are no other oscillation modes, which are unnecessary, than a required one in a mixed manner at the time of operation.

Further, the present invention provides a communication apparatus including a filter that has the above MEMS resonator.

A MEMS resonator according to the present invention includes a substrate in which a lower electrode is formed and a beam formed on this substrate, and has at least one support column between the substrate and the beam.

The support column can be formed at a position corresponding to a node of a desired oscillation mode of the beam. The support column can be formed such that both upper and lower ends thereof are integrated with the substrate and beam. Alternatively, the support column can be formed such that one end thereof is integrated with the substrate or beam and the other end thereof does not contact with the beam or substrate. As the lower electrode of the substrate, an input electrode for a high frequency signal and an output electrode for a high frequency signal are provided.

In the MEMS resonator of the present invention, since this MEMS resonator has at least one support column between the substrate and oscillation beam, the adsorption of the beam into the substrate can be prevented in the wet process at the time of manufacturing, particularly, in the process of removing the sacrifice layer. Specifically, since an effective length of the beam becomes short, the surface tension decreases, and the force to make the beam adsorbed into the substrate can be reduced. Since the support column is provided, the distance of the space between the beam and substrate can be set smaller.

Other unnecessary oscillation modes than the desired one can be suppressed since the support column is provided. Specifically, since the support column is provided at the position corresponding to the node of the desired oscillation mode, oscillation modes of unnecessary order-numbers are suppressed and so the oscillation mode of the desired order-number can be selected.

A first method of manufacturing a MEMS resonator according to the present invention includes the steps of: forming a lower electrode on a substrate; forming a sacrifice layer on the substrate including the lower electrode; selectively forming an opening that reaches the substrate at a portion where a support column should be formed in the sacrifice layer; forming a beam on the sacrifice layer and forming the support column integrated with the beam and substrate in the inside of the opening; and removing the sacrifice layer.

In the first method of manufacturing the MEMS resonator of the present invention, since the opening that reaches the substrate is selectively formed at the portion where the support column should be formed in the sacrifice layer after the lower electrode is formed on the substrate and the sacrifice layer is formed on the substrate including the lower electrode, the support column integrated with the beam and the substrate can be formed inside the opening simultaneously at the time of forming the beam thereafter. Since the support column is integrally formed with the substrate and beam, the beam can be prevented from being drawn to the substrate side at the time of removing the sacrifice layer.

A second method of manufacturing a MEMS resonator according to the present invention includes the steps of: forming a lower electrode and support column on a substrate; forming a sacrifice layer on the substrate including the lower electrode and support column; forming a beam on the sacrifice layer; and removing the sacrifice layer.

In the second method of manufacturing the MEMS resonator of the present invention, since the lower electrode and support column are formed on the substrate, the lower electrode and support column can be formed simultaneously by patterning the same material layer. Since a step of forming thereafter an opening in the sacrifice layer and the like becomes not necessary, the process can be simplified. When the beam is formed and the sacrifice layer is removed, the support column is formed to be integrated with the substrate but an upper end thereof is not in contact with the beam.

A third method of manufacturing a MEMS resonator according to the present invention includes the steps of: forming a lower electrode on a substrate; forming a sacrifice layer on the substrate including the lower electrode; selectively forming an opening whose depth does not reach the substrate at a portion where a support column should be formed in the sacrifice layer; forming a beam on the sacrifice layer and forming the support column integrated with the beam inside the opening; and removing the sacrifice layer.

In the third method of manufacturing the MEMS resonator of the present invention, since the opening whose depth does not reach the substrate is formed at the portion where the support column should be formed in the sacrifice layer, the support column is formed to be integrated with the beam but a lower end thereof is not in contact with the substrate. It becomes possible to make a space between the support column and the substrate smaller than a space between the beam and the lower electrode by controlling the depth of the opening, and the beam can be prevented from being drawn to the substrate side at the time of removing the sacrifice layer.

A communication apparatus according to the present invention is the communication apparatus provided with a filter to limit a band of a transmission signal and/or reception signal, includes a filter that has the above-described MEMS resonator used as the filter. Since the communication apparatus of the present invention includes the filter that has the MEMS resonator according to the present invention, a desired frequency signal can be selected accurately with this filter.

According to the MEMS resonator of the present invention, since the support column is provided between the beam and the substrate as described above, the adsorption of the beam into the substrate can be prevented in the wet process during the manufacturing process, and a yield of the MEMS resonator can be improved. With the support column being provided, an oscillation mode of an unnecessary order-number is suppressed and so the oscillation mode of the desired order-number can be selected.

Specifically, with the support column being provided at the position corresponding to the node of the oscillation mode of the desired order-number, unnecessary oscillation modes other than the desired one can be suppressed. Accordingly, since only the signal of the desired frequency is transmitted, the performance as the resonator is improved.

Even if the length of the beam becomes long, the strength of the beam can be maintained since the support column is provided. In addition, since the distance of the space is made smaller between the beam and the lower electrode, a large amount of signal can be obtained.

When both the upper and lower ends of the support column are integrated with the beam and substrate, an oscillation mode of an unnecessary order-number is suppressed more securely and so only the oscillation mode of the desired order-number can be selected.

Even if either one of the upper and lower ends of the support column is not integrated with the beam or substrate, an oscillation mode of an unnecessary order-number is suppressed and so only the oscillation mode of the desired order-number can be selected.

When the lower electrode of the substrate is made of the input electrode of the high frequency signal and the output electrode of the high frequency signal, in addition to the effectiveness of having the support column, parasitic capacitance generated between the input and output electrodes decreases and so a noise component can be reduced. Therefore, a resonator having a high S/N ratio can be provided.

According to the methods of manufacturing the MEMS resonator of the present invention, a phenomenon of the adsorption of the beam into the substrate in the wet process is prevented, because the process of forming the support column is included, and the MEMS resonator driven by the oscillation mode of the desired order-number can be manufactured with a favorable yield.

According to the communication apparatus of the present invention, since the filter that has the above-described MEMS resonator is included, a highly reliable communication apparatus can be provided.

BEST MODE FOR CARRYING OUT THE INVENTION

Hereinafter, embodiments of the present invention are explained by referring to the accompanied drawings.

Figure 1:
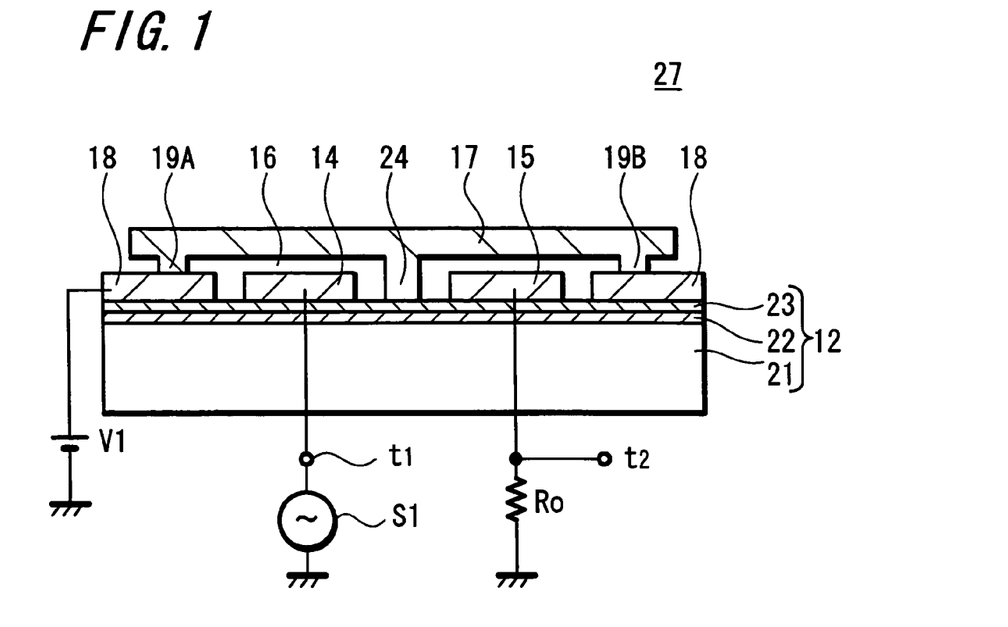
FIG. 1 is a constitutional diagram showing an embodiment of a MEMS resonator according to the present invention.

FIG. 1 shows an embodiment of a MEMS resonator according to the present invention. A MEMS resonator 27 according to this embodiment includes: lower electrodes disposed at required intervals on the same plain of a substrate 12, specifically, an input electrode 14 to input a high frequency signal and an output electrode 15 to output a high frequency signal in this example, a beam disposed to face those input and output electrodes 14 and 15 separated by a space 16, specifically, an oscillation electrode 17, and a support column 24 provided between the substrate 12 and the oscillation electrode 17. The oscillation electrode 17 straddles the input and output electrodes 14 and 15 like a bridge and is integrally supported by support portions (what is called anchor portions) 19 [19A, 19B] at both ends to be connected to wirings 18 disposed outside of the input and output electrodes 14 and 15.

In accordance with a required order-number oscillation mode of the oscillation electrode 17, one or plurality of support columns 24, in this example one according to a second-order oscillation mode, is provided at a position corresponding to a node of an oscillation thereof, that is, at a position between the input electrode 14 and the output electrode 15. The support column 24 is integrated with the oscillation electrode 17 and substrate 12 at both upper and lower ends thereof.

A substrate having at least an insulating surface is used as the substrate 12. For example, a substrate in which an insulation film is formed on a semiconductor substrate such as silicon (Si) and gallium arsenide (GaAs), an insulating substrate such as a quartz substrate and a glass substrate, and the like are used as the substrate 12. In this example, the substrate 12 in which a silicon oxide film 22 and a silicon nitride film 23 are laminated on a silicon substrate 21 is used. The input electrode 14, output electrode 15, and wiring layers 18 are formed of the same conductive material, and can be formed of a polycrystalline silicon film and a metal film such as aluminum (Al), for example. The oscillation electrode 17 can be formed of a polycrystalline silicon film and a metal film such as aluminum (Al), for example.

In the input electrode 14, an input terminal t1 is led out so that a high frequency signal S1 is input into the input electrode 14 through the input terminal t1. In the output electrode 15, an output terminal t2 is led out so that a high frequency signal of an objective frequency is output from the output terminal t2. A required DC bias voltage V1 is applied to the oscillation electrode 17.

An operation of this MEMS resonator 27 is as follows.

The required DC bias voltage V1 is applied to the oscillation electrode 17. The high frequency signal S1 is input into the input electrode 14 through the input terminal t1. When a high frequency signal of an objective frequency is input, the oscillation electrode 17 resonates in a second-order oscillation mode by electrostatic power generated between the oscillation electrode 17 and the input electrode 14 as shown in FIG. 3. With the resonance of the oscillation electrode 17, a high frequency signal of an objective frequency is output from the output electrode 15 through the output terminal t2.

Figure 2:
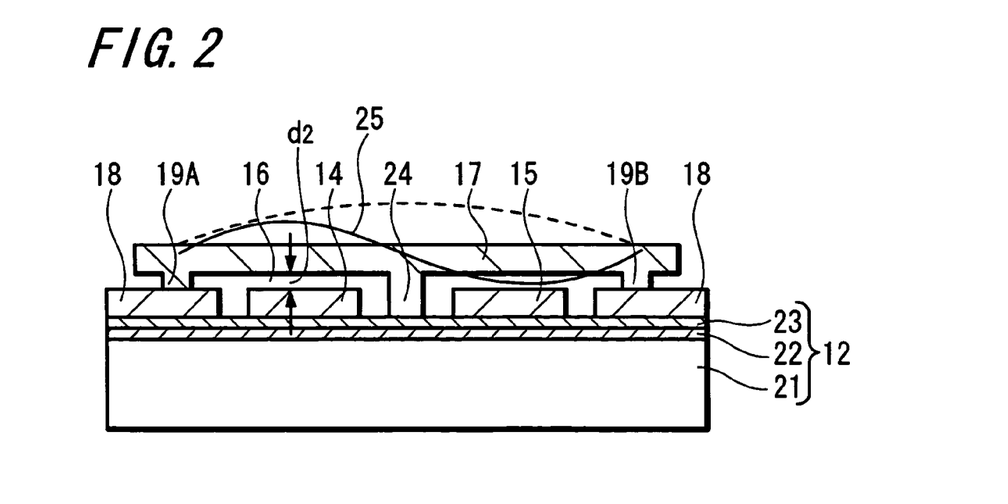
FIG. 2 is an explanatory diagram illustrating an operation of the MEMS oscillator of FIG. 1.
Figure 3A:
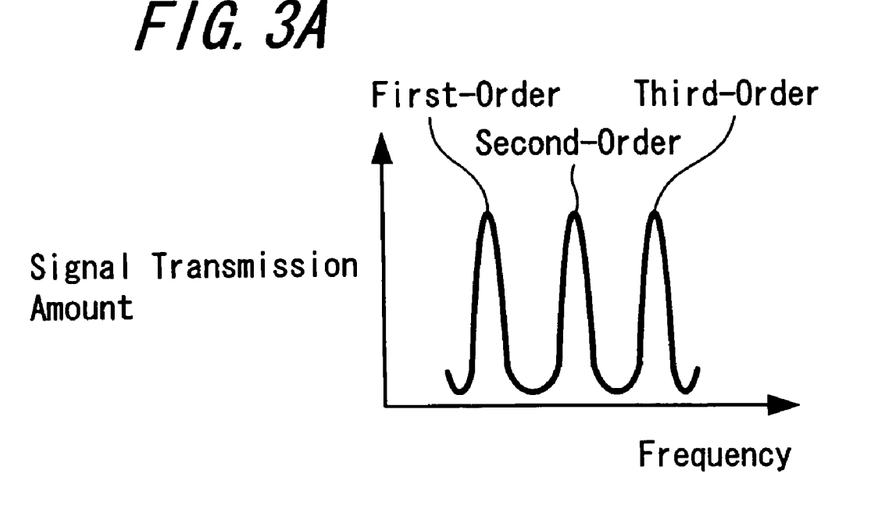
FIG. 3A is an explanatory diagram showing frequency-signal transmission amount of a MEMS resonator.
Figure 3B:
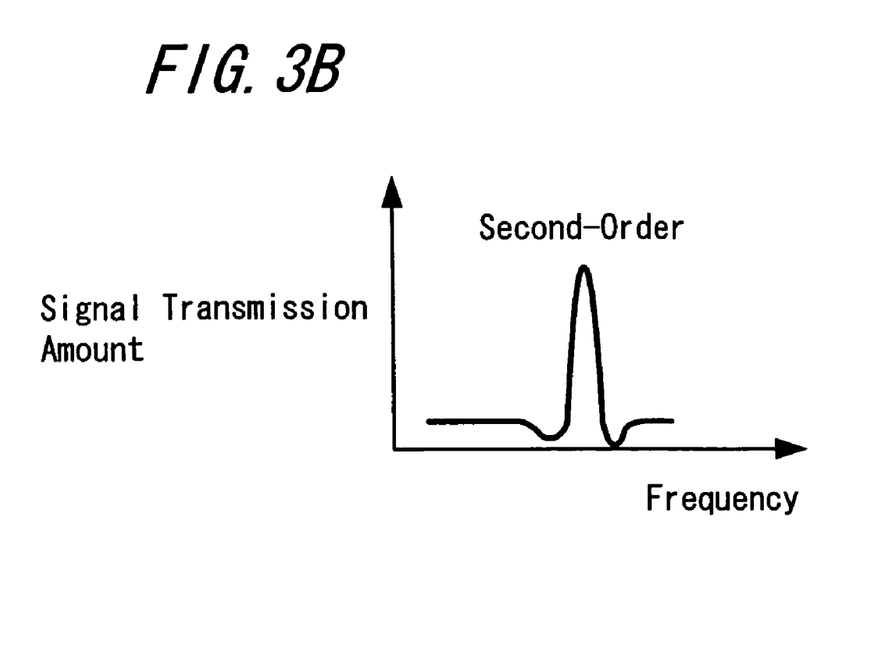
FIG. 3B is an explanatory diagram showing frequency-signal transmission amount of a MEMS resonator according to the present invention.

Further, according to the MEMS resonator 27 of this embodiment, as shown in FIG. 2, since the support column 24 integrated with the substrate 12 and oscillation electrode 17 is provided at a position corresponding to a node of a second-order oscillation mode 25, other oscillation modes such as first-order and third-order oscillation modes, for example, are suppressed and so only the second-order oscillation mode 25 can be selected. As shown in FIG. 3, only the second-order oscillation mode (refer to FIG. 3B) can be selected among multi-order oscillation modes of the first-order, second-order, and third-order (refer to FIG. 3A). The reason for that is because the oscillation electrode 17 is not able to oscillate in the first-order and third-order oscillation modes when there is the support column 24 in the center of the oscillation electrode 17, signals of the first-order and third-order do not transmit.

Thus, only the signal of the desired frequency can transmit, and the performance as the resonator improves.

In addition, with the support column 24 being provided, an adsorption of the oscillation electrode 17 into the side of the substrate 12 in a wet process during a manufacturing process which is described later on can be prevented. This is because surface tension decreases due to a reason that an effective length of the oscillation electrode 17 becomes short by the support column 24 and a force to adsorb the oscillation electrode 17 into the side of the substrate 12 deceases. A resonator in which an oscillation electrode 17 is adsorbed does not operate and therefore can not be used. However, in the MEMS resonator 27 of this embodiment, the adsorption of the oscillation electrode 17 into the side of the substrate 12 decreases and so a yield of this kind of resonator can be improved.

It becomes possible to make a film thickness of the oscillation electrode 17 thinner, or to make a distance d2 of the space between the oscillation electrode 17 and the input and output electrodes 14 and 15 narrower. The smaller the distance d2 is, the more a signal amount increases. Accordingly, the performance as the resonator can be improved.

In addition, with the support column 24 being provided, the strength of the oscillation electrode 17 can be maintained even if a longer oscillation electrode 17 is made.

Figure 4:
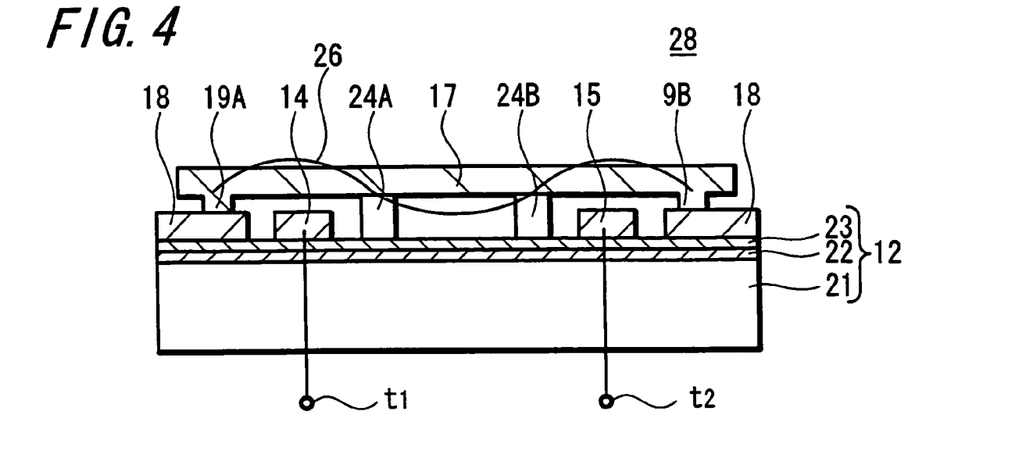
FIG. 4 is a constitutional diagram showing another embodiment of a MEMS resonator according to the present invention.

FIG. 4 shows another embodiment of a MEMS resonator according to the present invention. A MEMS resonator 28 according to this embodiment is a case where a third-order oscillation mode is selected.

The MEMS resonator 28 of this embodiment also includes: an input electrode 14 and an output electrode 15 formed on a substrate 12 and an oscillation electrode 17 disposed to face the input and output electrodes 14 and 15. Further, in this embodiment, particularly the MEMS oscillator 28 includes two support columns 24 [24A, 24B] respectively provided at positions corresponding to two nodes of a third-order oscillation mode 26. Since the other structure is similar to FIG. 1, the same reference numerals are given to corresponding portions and a duplicated explanation thereof is omitted.

According to the MEMS resonator 28 of this embodiment, with the two support columns 24A and 24B being provided, the third-order oscillation mode is selected and the other oscillation mode can be suppressed. In addition, a similar effectiveness to the embodiment of FIG. 1 can be obtained such that the strength of the oscillation electrode 17 is maintained and the adsorption of the oscillation electrode 17 into the side of the substrate 12 can be prevented in the wet process.

In the MEMS resonator, the beam 17 is adsorbed into the side of the substrate 12 without fail, when the thickness of the beam that becomes the oscillation electrode 17 is 0.5 μm or less, the length of the beam is approximately 10 μm, and the distance d2 of the space between the beam 17 and the lower electrodes 14 and 15 is 100 μm or less. On the contrary, the adsorption can be prevented in this embodiment and at the same time, a higher-order oscillation mode can be selected when multi-order oscillation modes are used in a RF resonator, for example.

Figure 7A:
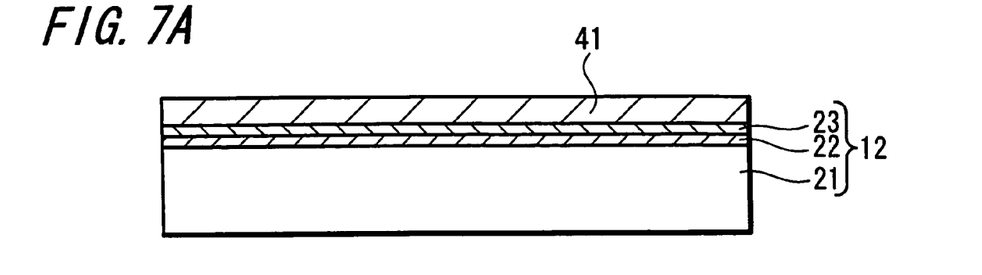
FIGS. 7A through 7D are manufacturing process diagrams (1/2) of the MEMS resonator of FIG. 1.
Figure 7B:
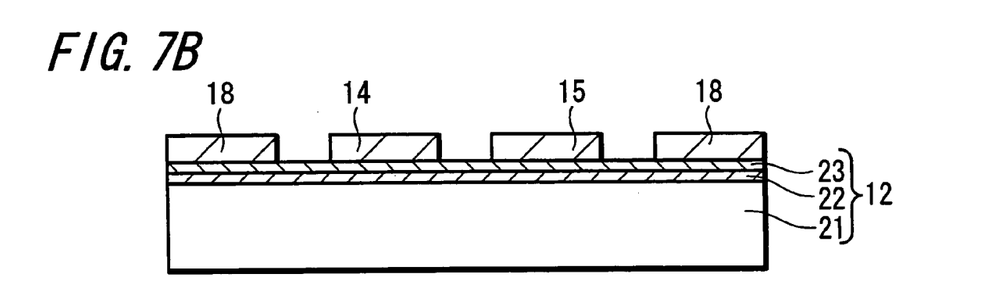
Figure 7C:
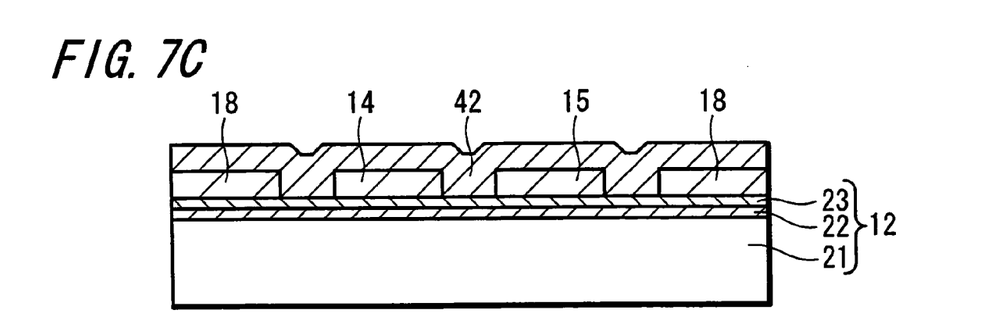
Figure 7D:
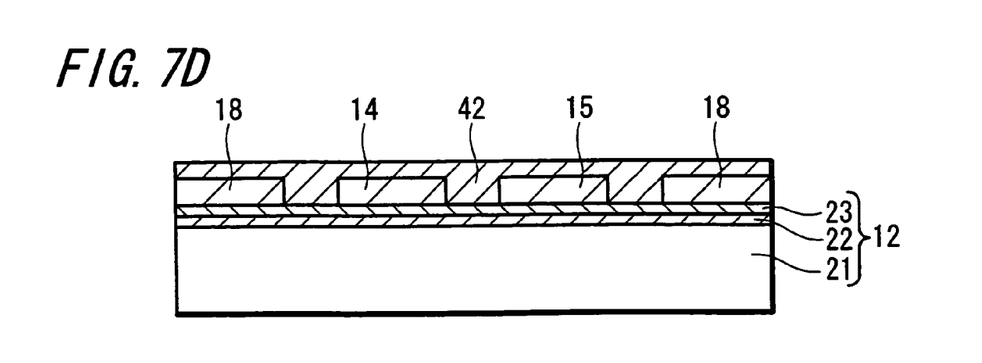
Figure 8A:
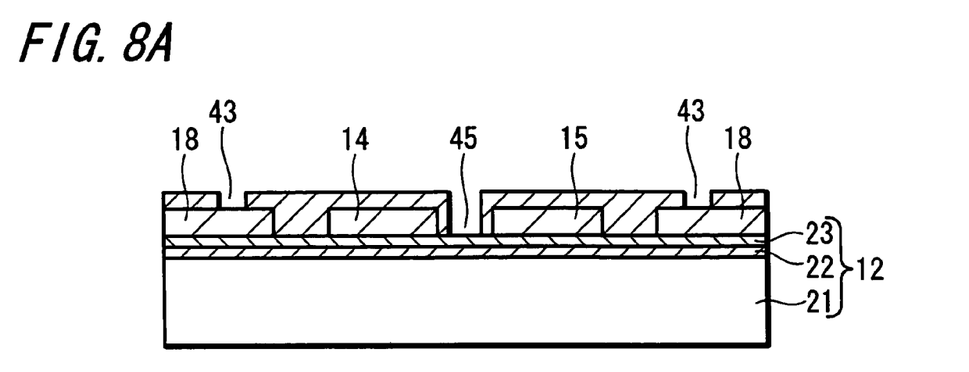
FIGS. 8A through 8C are manufacturing process diagrams (2/2 2) of the MEMS resonator of FIG. 1.
Figure 8B:
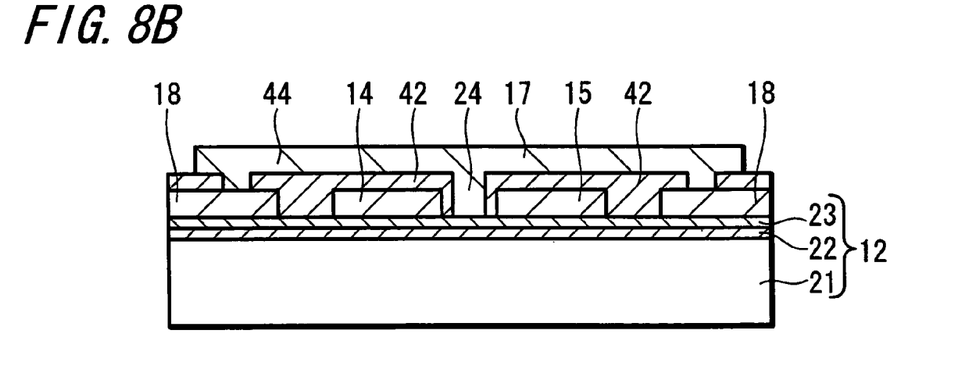
Figure 8C:
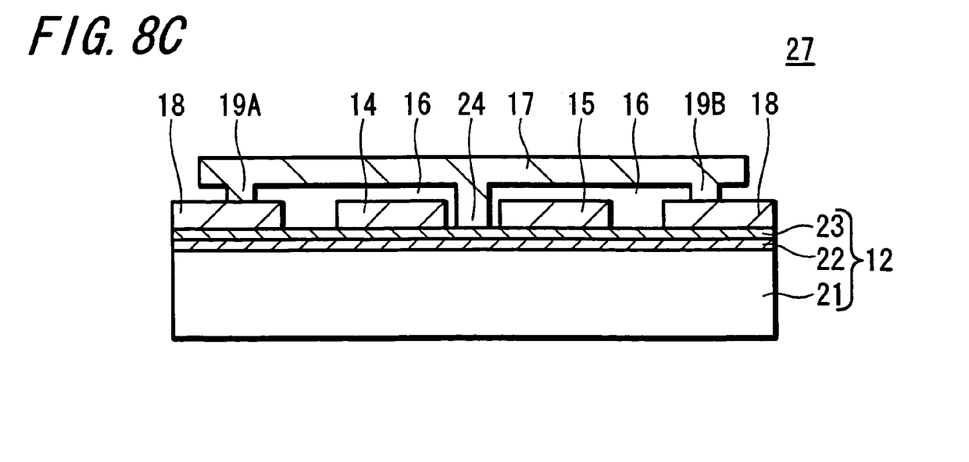

FIGS. 7 and 8 show an example of a method of manufacturing the above-described MEMS resonator 27 shown in FIG. 1.

First, as shown in FIG. 7A, a conductive film 41 to become the electrode is formed on the substrate 21. In this example, the substrate 12 in which the silicon oxide film 22 and silicon nitride film 23 of the insulation films are laminated on the silicon substrate 21 is used. The conductive film 41 is required to be formed of a material which can obtain an etching ratio to a sacrifice layer formed later on, and this conductive film is formed of a polycrystalline silicon film in this example.

Next, as shown in FIG. 7B, the input electrode 14, output electrode 15, and outside wiring layers 18 are formed by patterning the conductive layer 41.

Next, as shown in FIG. 7C, a sacrifice layer 42 is formed on the whole surface including the input electrode 14, output electrode 15, and wiring layers 18. The sacrifice layer 42 is formed of a material, a silicon oxide ($SiO_2$) film in this example, which can obtain an etching ratio to the base insulation film (in this example, a silicon nitride (SiN) film) 23 and to each of the electrodes 14, 15 and wiring layers 18 that are made of polycrystalline silicon.

Next, as shown in FIG. 7D, the sacrifice layer 42 is planarized by a chemical mechanical polishing (CMP) method or the like, for example.

Next, as shown in FIG. 8A, contact holes 43 are formed on the both wiring layers 18 outside by selectively etching the sacrifice layer 42, and an opening 45 whose depth reaches the substrate 12 is formed at the position between the input and output electrodes 14 and 15, specifically, at the position corresponding to the node of the second-order oscillation in this example.

Next, as shown in FIG. 8B, a conductive film 44 to be the oscillation electrode and support column, which is a polycrystalline silicon film that can obtain the etching ratio to the sacrifice layer 42 in this example, is formed on the sacrifice layer 42 including the contact holes 43 and inside the opening 45. Thereafter, the oscillation electrode 17 made of the polycrystalline silicon film, which is connected to the both outside wiring layers 18, and the support column 24 integrated with the oscillation electrode 17 and substrate 12, which is provided inside the opening 45, are formed by patterning the conductive film 44. Portions between the oscillation electrode 17 and the wiring layers 18 become the support portions (anchors) 19 [19A, 19B] which support the oscillation electrode 17 as a both-ends supported beam structure.

Next, as shown in FIG. 8C, the sacrifice layer 42 is removed by etching. Since the sacrifice layer 42 is the silicon oxide film in this example, wet etching is performed using a fluoric acid solution. Thus, the objective MEMS resonator 27 having the support column 24 integrally formed between the oscillation electrode 17 to be the beam and the substrate 12 is obtained.

According to the embodiment of the method of manufacturing, the MEMS resonator 27 shown in FIG. 1 can be manufactured accurately. Further, with the support column 24 being formed between the oscillation electrode 17 and the substrate 12, the oscillation electrode 17 can be prevented from sticking, which occurs after the removal of the sacrifice layer 42 with the wet etching, to the input electrode 14 and output electrode 15, for example, on the side of the substrate 12. Therefore, the MEMS resonator 27 whose signal amount increases can be manufactured accurately by further making the space 16 between the oscillation electrode 17 and the input and output electrodes 14 and 15 smaller.

Figure 5:
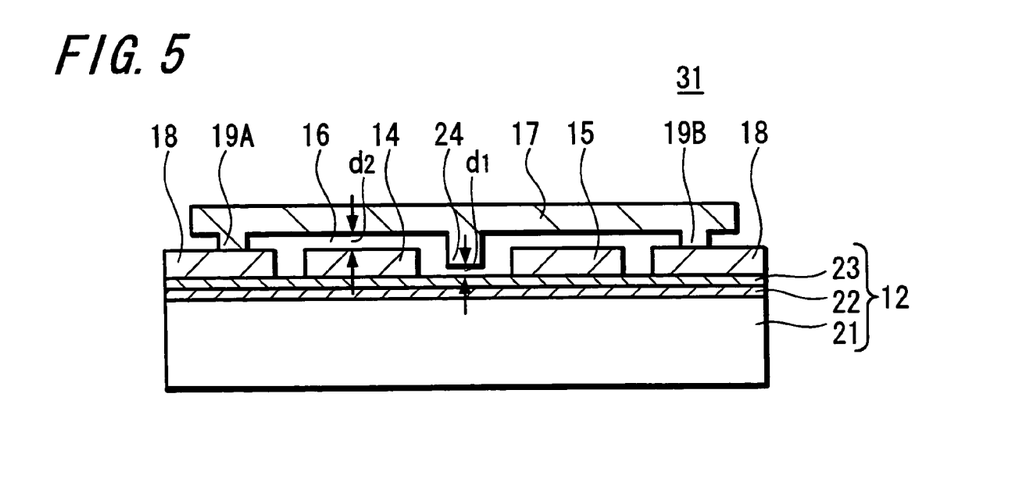
FIG. 5 is a constitutional diagram showing further another embodiment of a MEMS resonator according to the present invention.

FIG. 5 shows further another embodiment of a MEMS resonator according to the present invention. This embodiment is a case where the present invention is applied to a resonator of a second-order oscillation mode similarly to the above-described FIG. 1.

Similarly to the above, a MEMS resonator 31 according to this embodiment includes: lower electrodes disposed at required intervals on the same plane of a substrate 12, specifically, an input electrode 14 to input a high frequency signal and an output electrode 15 to output a high frequency signal in this example, a beam disposed to face those input and output electrodes 14 and 15 separated by a space 16, specifically, an oscillation electrode 17, and a support column 24 provided between the substrate 12 and the oscillation electrode 17. The oscillation electrode 17 straddles the input and output electrodes 14 and 15 like a bridge, and is integrally supported by support portions (what is called anchor portions) 19 [19A, 19B] at both ends to be connected to wirings 18 which are disposed outside the input and output electrodes 14 and 15. According to a required order-number oscillation mode of the oscillation electrode 17, one or plurality of support column 24, one according to a second-order oscillation mode in this example, is provided at a position between the input electrode 14 and the output electrode 15, where is a position corresponding to a node of an oscillation thereof.

Further, in this embodiment, particularly the support column 24 is made such that one end thereof is integrated with the oscillation electrode 17 and the other end thereof is slightly separated from the substrate 12 not to contact with the substrate 12. In this case, a gap d1 between the other end of the support column 24 and the substrate 12 is set smaller than a distance d2 of the space 16 between the oscillation electrode 17 and the input and output electrodes 14 and 15.

Since the other structure is similar to the above-described FIG. 1, the same reference numerals are given to those portions corresponding to FIG. 1 and a duplicated explanation thereof is omitted.

According to the MEMS resonator 31 of this embodiment, since the support column 24 is formed at the position corresponding to the node of the second-order oscillation mode between the oscillation electrode 17 and the substrate 12, the second-order oscillation mode can be selected among multi-order oscillation modes similarly to the one described above and only a required high frequency signal can be transmitted. In addition, since the support column 24 is provided, the strength of the oscillation electrode 17 is maintained, and the adsorption of the oscillation electrode 17 into the side of the substrate 12 can be prevented in a wet process during a manufacturing process. Therefore, the film thickness of the oscillation electrode 17 can be made thinner or the distance d2 of the space 16 between the oscillation electrode 17 and the input and output electrodes 14 and 15 can be made narrower. Accordingly, the performance as the resonator can be improved.

Figure 9A:
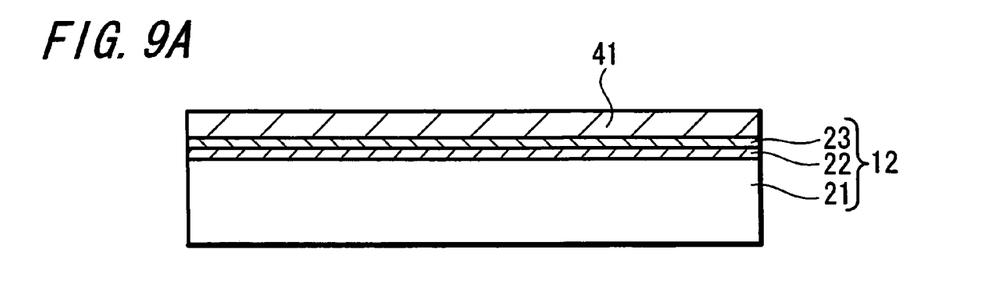
FIGS. 9A through 9D are manufacturing process diagrams (1/2) of the MEMS resonator of FIG. 5.
Figure 9B:
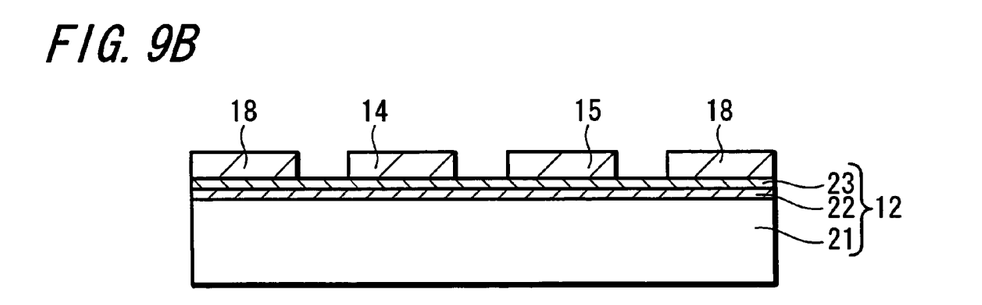
Figure 9C:
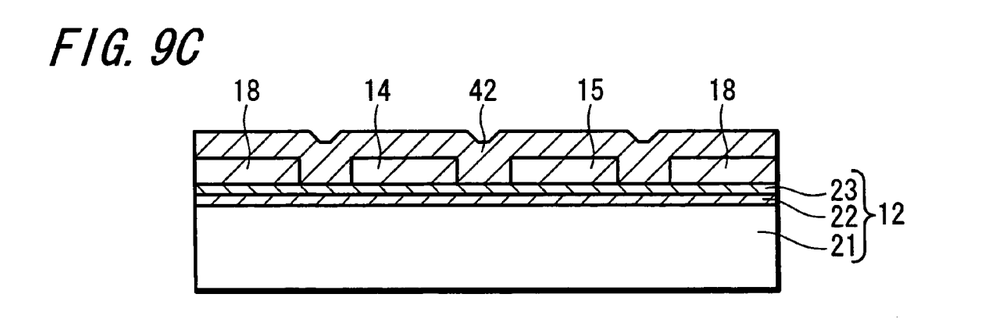
Figure 9D:
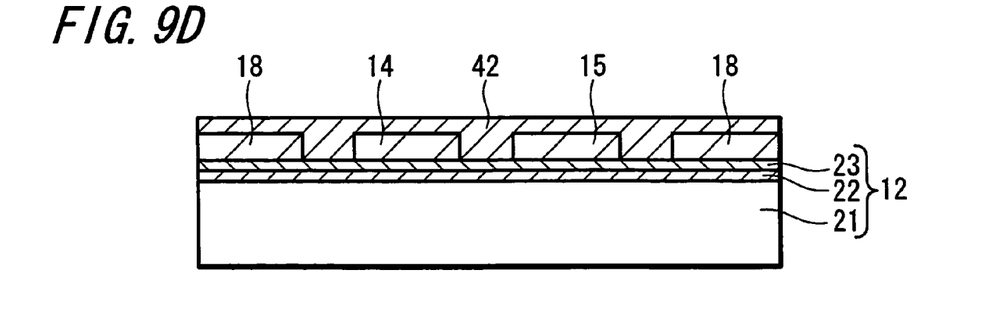
Figure 10A:
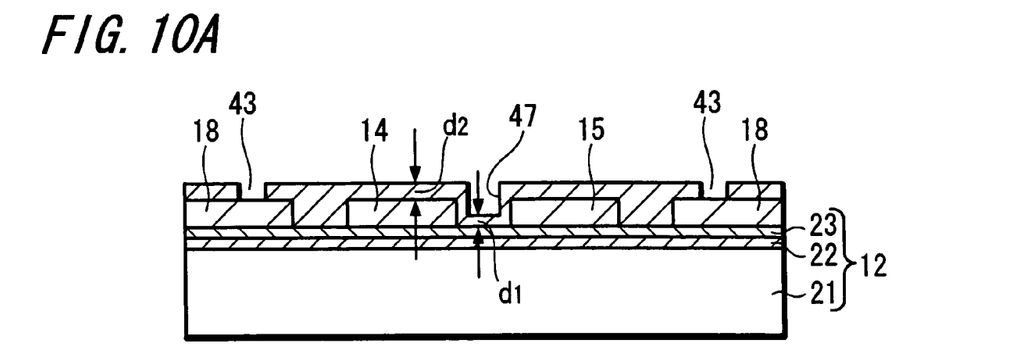
FIGS. 10A through 10C are manufacturing process diagrams (2/2) of the MEMS resonator of FIG. 5.
Figure 10B:
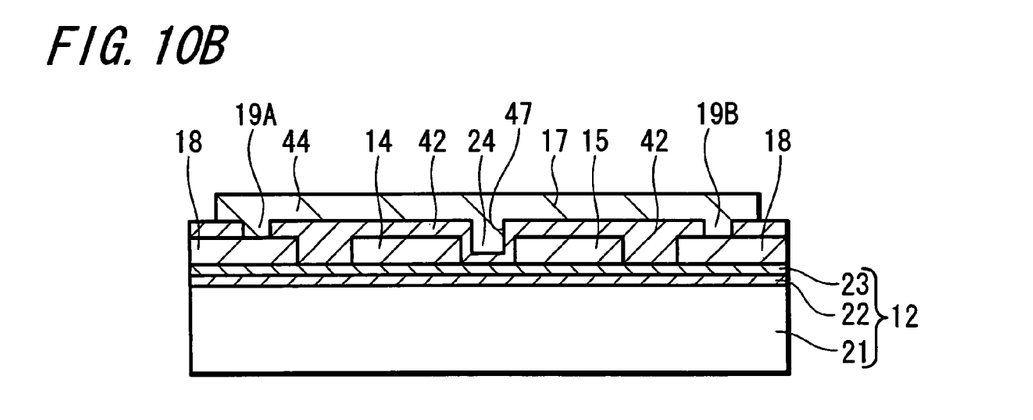
Figure 10C:
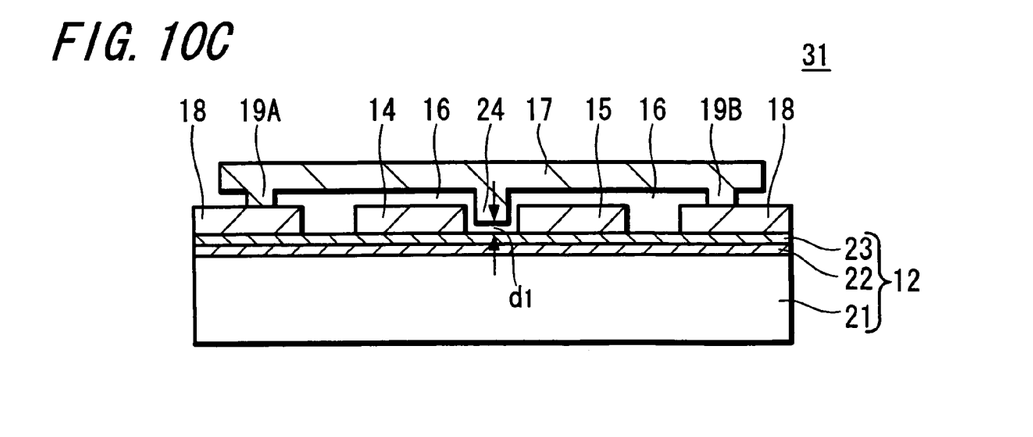

FIGS. 9 and 10 show an example of a method of manufacturing the above-described MEMS resonator 31 shown in FIG. 5.

First, processes of FIGS. 9A through 9D are the same as the above-described processes of FIGS. 7A through 7D. Specifically, a conductive film 41 to be an electrode is formed on the substrate 12 as shown in FIG. 9A. In this example, the conductive film 41 made of a polycrystalline silicon film is formed on the substrate 12 in which the silicon oxide film 22 and silicon nitride film 23 of insulation films are laminated on the silicon substrate 21.

Next, as shown in FIG. 9B, the input electrode 14, output electrode 15, and outside wiring layers 18 are formed by patterning the conductive layer 41.

Next, as shown in FIG. 9C, a sacrifice layer 42 is formed on the whole surface including the input electrode 14, output electrode 15, and wiring layers 18. The sacrifice layer 42 is formed of a material, a silicon oxide ($SiO_2$) film in this example, which can obtain an etching ratio to the base insulation film (in this example, a silicon nitride (SiN) film) 23 and each of the electrodes 14, 15 and wiring layers 18 that are made of polycrystalline silicon.

Next, as shown in FIG. 9D, the sacrifice layer 42 is planarized by the chemical mechanical polishing (CMP) method and the like, for example.

Next, as shown in FIG. 10A, the sacrifice layer 42 is selectively etched to form contact holes 43 on both the outside wiring layers 18, and an opening 47 whose depth does not reach the substrate 12 with the sacrifice layer 42 slightly being left is formed at a position between the input and output electrodes 14 and 15, specifically, at a position corresponding to a node of a second-order oscillation mode in this example. It is desirable that a) thickness d1 of the sacrifice layer 42 remaining inside the opening 47 is set smaller than the film thickness d2 of the sacrifice layer on the input and output electrodes 14 and 15.

Next, as shown in FIG. 10B, a conductive film 44 that becomes the oscillation electrode and the support column, which is a polycrystalline silicon film in this example that can obtain an etching ratio to the sacrifice layer 42, is formed on the sacrifice layer 42 including the contact holes 43 and the inside of the opening 47. Thereafter, the oscillation electrode 17 made of the polycrystalline silicon film, which is connected to the both outside wiring layers 18, is formed by patterning the conductive film 44. Portions between the oscillation electrode 17 and the wiring layers 18 become the support portions (anchors) 19 [19A, 19B] that support the oscillation electrode 17 integrally formed with the support column 24 as a both-ends supported beam structure.

Next, as shown in FIG. 10C, the sacrifice layer 42 is removed by etching. The sacrifice layer 42 is etched and removed by wet etching using a fluoric acid solution since the sacrifice layer 42 is the silicon oxide film in this example. Thus, the objective MEMS resonator 31 that includes the support column 24 integrated with the oscillation electrode 17 that becomes the beam, which is formed with the small gap d1 left with respect to the substrate 12, is obtained.

According to the method of manufacturing this embodiment, the MEMS resonator 31 shown in FIG. 5 can be manufactured accurately. Specifically, also in this example, since the support column 24 is formed between the oscillation electrode 17 and the substrate 12, the oscillation electrode 17 can be prevented from sticking, which occurs after the sacrifice layer 42 is removed by the wet etching, to the side of the substrate 12, for example, to the input electrode 14 and output electrode 15. Therefore, it is possible to manufacture accurately the MEMS resonator 31 whose signal amount is increased by making further small the space 16 between the oscillation electrode 17 and the input and output electrodes 14 and 15.

Figure 6:
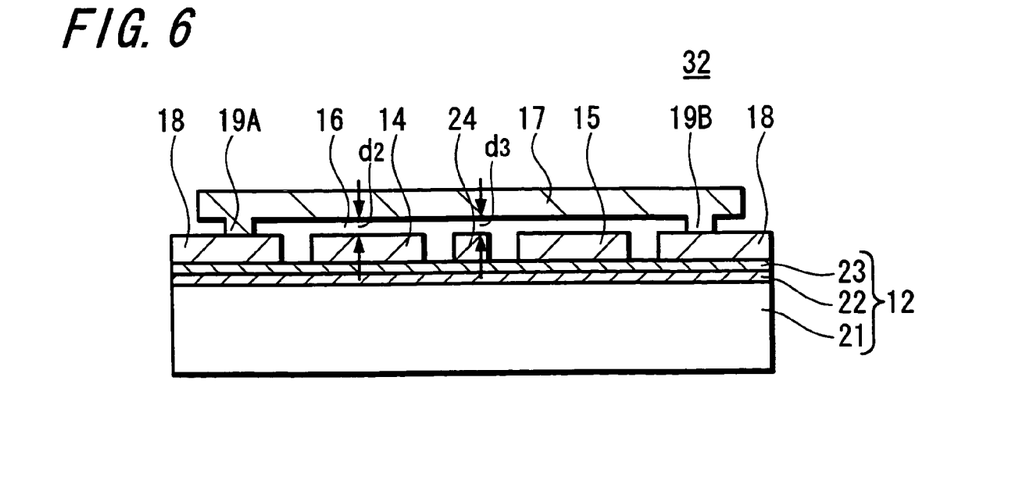
FIG. 6 is a constitutional diagram showing still another embodiment of a MEMS resonator according to the present invention.

FIG. 6 shows further another embodiment of a MEMS resonator according to the present invention. Similarly to the above-described FIG. 1, this embodiment is a case where the present invention is applied to a resonator of a second-order oscillation mode.

Similarly to the one described above, a MEMS resonator 32 according to this embodiment includes: lower electrodes which are disposed with required intervals on the same plane of a substrate 12, specifically, an input electrode 14 to input a high frequency signal and an output electrode 15 to output a high frequency signal in this example, a beam disposed to face those input and output electrodes 14 and 15 separated by a space 16, specifically, an oscillation electrode 17, and a support column 24 provided between the substrate 12 and the oscillation electrode 17. The oscillation electrode 17 straddles the input and output electrodes 14 and 15 like a bridge, and is integrally supported by support portions (what is called anchor portions) 19 [19A, 19B] at both ends to be connected to wirings 18 disposed outside the input and output electrodes 14 and 15. According to a required order-number oscillation mode of the oscillation electrode 17, one or plurality of support column 24, one according to a second-order oscillation mode in this example, is provided at a position between the input electrode 14 and the output electrode 15, corresponding to a node of an oscillation thereof.

Further, in this embodiment, particularly one end of the support column 24 is integrated with the substrate 12 and the other end thereof is provided being slightly separated from the oscillation electrode 17 not to contact with the oscillation electrode 17. In this case, it is desirable that a distance d3 between the other end of the support column 24 and the oscillation electrode 17 is set smaller than a distance d2 of the space 16 between the oscillation electrode 17 and the input and output electrodes 14 and 15. It should be noted that the distance d3 can also be set to be equal to the distance d2.

Since the other structure is similar to the above-described FIG. 1, the same reference numerals are given to those portions corresponding to FIG. 1 and a duplicated explanation thereof is omitted.

According to the MEMS resonator 32 of this embodiment, since the support column 24 is formed at the position corresponding to the node of the second-order oscillation mode between the oscillation electrode 17 and the substrate 12, the second-order oscillation mode can be selected from among multi-order oscillation modes, similarly to the one described above and so only a desired high frequency signal can be transmitted. Further, since the support column 24 is provided, the strength of the oscillation electrode 17 can be maintained and the adsorption of the oscillation electrode 17 into the side of the substrate 12 can be prevented in the wet process during the manufacturing process. Therefore, the film thickness of the oscillation electrode 17 can be made thinner or the distance d2 of the space 16 between the oscillation electrode 17 and the input and output electrodes 14 and 15 can be made narrower. Accordingly, the performance as the resonator can be improved.

Figure 11A:
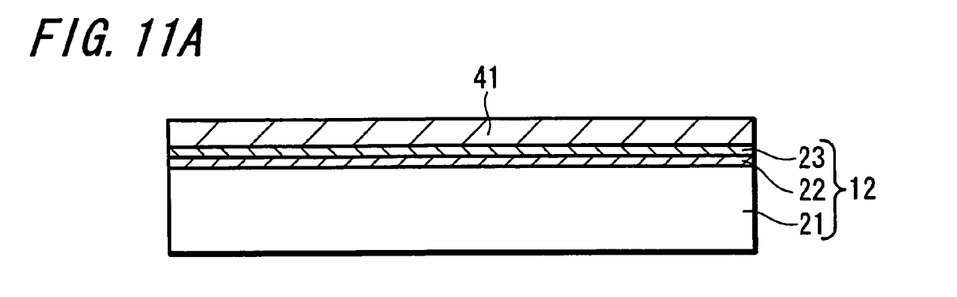
FIGS. 11A through 11D are manufacturing process diagrams (1/2) of the MEMS resonator of FIG. 6.
Figure 11B:
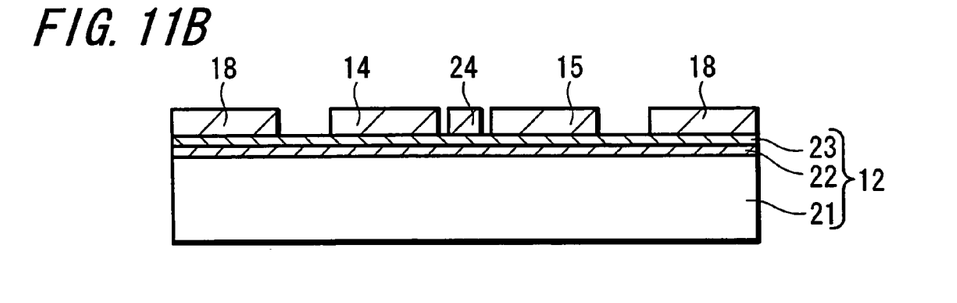
Figure 11C:
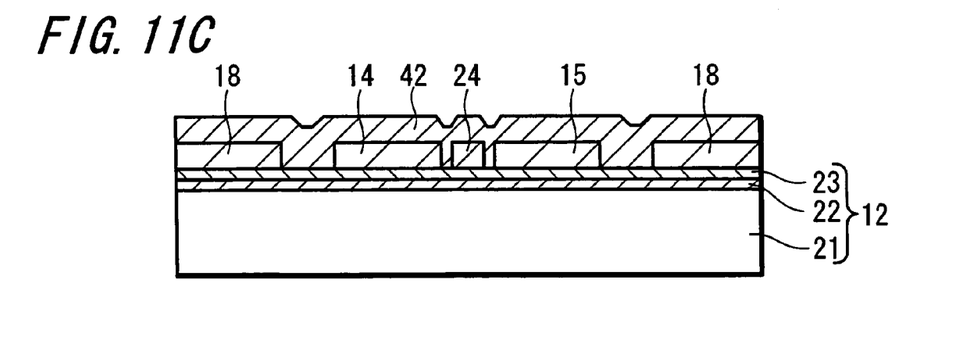
Figure 11D:
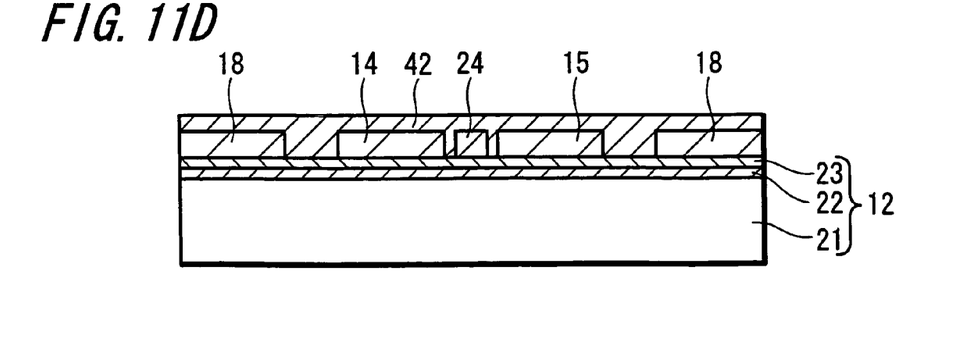
Figure 12A:
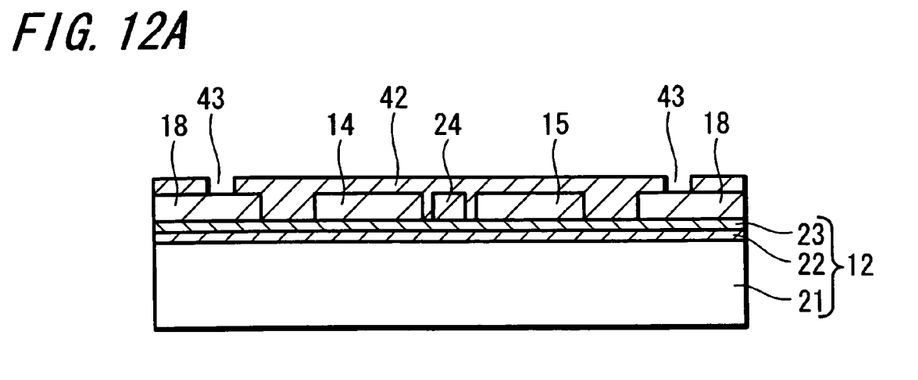
FIGS. 12A through 12C are manufacturing process diagrams (2/2) of the MEMS resonator of FIG. 6.
Figure 12B:
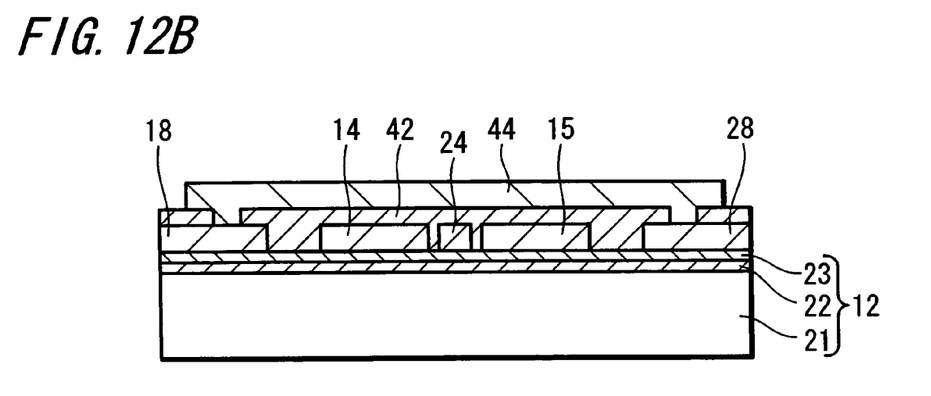
Figure 12C:
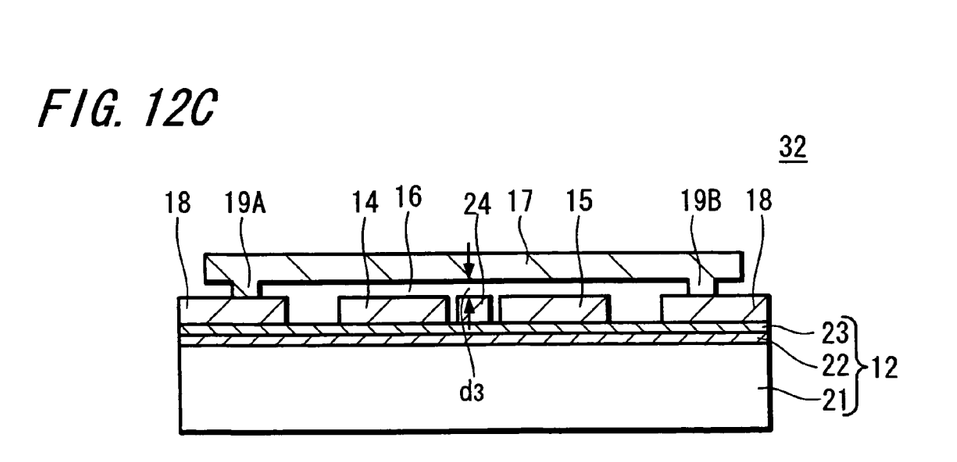

FIGS. 11 and 12 show an example of a method of manufacturing the above-described MEMS resonator 32 shown in FIG. 6.

As shown in FIG. 11A, a conductive film 41 to become the electrode is formed on the substrate 12 similarly to the above-described FIG. 7A. In this example, the conductive film 41 made of a polycrystalline silicon film is formed on the substrate 12 in which the silicon oxide film 22 and silicon nitride film 23 of insulation films are laminated on the silicon substrate 21.

Next, as shown in FIG. 11B, the input electrode 14, output electrode 15, outside wiring layers 18, and the support column 24 are formed by patterning the conductive film 41.

Next, as shown in FIG. 11C, a sacrifice layer 42 is formed on the whole surface including the input electrode 14, output electrode 15, wiring layers 18, and support column 24. The sacrifice layer 42 is formed of a material, a silicon oxide ($SiO_2$) film in this example, which can obtain an etching ratio to the base insulation film (in this example, silicon nitride (SiN) film) 23, the input and output electrodes 14, 15, the wiring layers 18 and support column 24 that are made of polycrystalline silicon.

Next, as shown in FIG. 11D, the sacrifice layer 42 is planarized by the chemical mechanical polishing (CMP) method and the like, for example.

Next, as shown in FIG. 12A, contact holes 43 are formed by selective etching in the sacrifice layer 42 on the both outside wiring layers 18.

Next, as shown in FIG. 12B, a conductive film 44 that becomes the oscillation electrode, which is a polycrystalline silicon film that can obtain an etching ratio to the sacrifice layer 42 in this example, is formed on the sacrifice layer 42 including the inside of the contact holes 43. Thereafter, the oscillation electrode 17 made of the polycrystalline silicon film connected to the both outside wiring layers 18 is formed by patterning the conductive film 44. Portions between the oscillation electrode 17 and the wiring layers 18 become support portions (anchors) 19 [19A, 19B] that support the oscillation electrode 17 as a both-ends supported beam structure.

Next, as shown in FIG. 12C, the sacrifice layer 42 is removed by etching. Since the sacrifice layer 42 is the silicon oxide film in this example, the sacrifice layer 42 is etched and removed by wet etching using a fluoric acid solution. Thus, the objective MEMS resonator 32 that includes the support column 24 integrated with the substrate 12, which is formed with a small gap d3 remaining with respect to the oscillation electrode 17 that becomes a beam, can be obtained.

According to the method of manufacturing this embodiment, the MEMS resonator 32 shown in FIG. 6 can be manufactured accurately. Specifically, since the support column 24 is formed between the oscillation electrode 17 and the substrate 12 also in this example, the oscillation electrode 17 is prevented from sticking, which occurs after the sacrifice layer 42 is removed by the wet etching, to the side of the substrate 12, for example, to the input electrode 14 and output electrode 15. Accordingly, the MEMS resonator 32 whose signal amount is increased by further making the space 16 between the oscillation electrode 17 and the input and output electrodes 14 and 15 small can be manufactured accurately.

In the above description, the present invention is applied to the MEMS resonator in which the input electrode 14 and output electrode 15 are disposed to face the oscillation electrode 17 on the substrate 12, however, the support column of the present invention can also be provided between the substrate 2 and the oscillation electrode 7 in the MEMS resonator shown in FIG. 15.

A filter including the above-described MEMS resonator of each embodiment can be used as a high frequency (RF) filter, an intermediate frequency (IF) filter, and the like.

The present invention can provide a communication apparatus that performs communication by using an electromagnetic wave, such as a mobile phone unit, a wireless LAN device, a wireless transceiver, a television tuner, and a radio tuner, which include the filter that has the MEMS resonator of the above-described embodiment.

Figure 13:
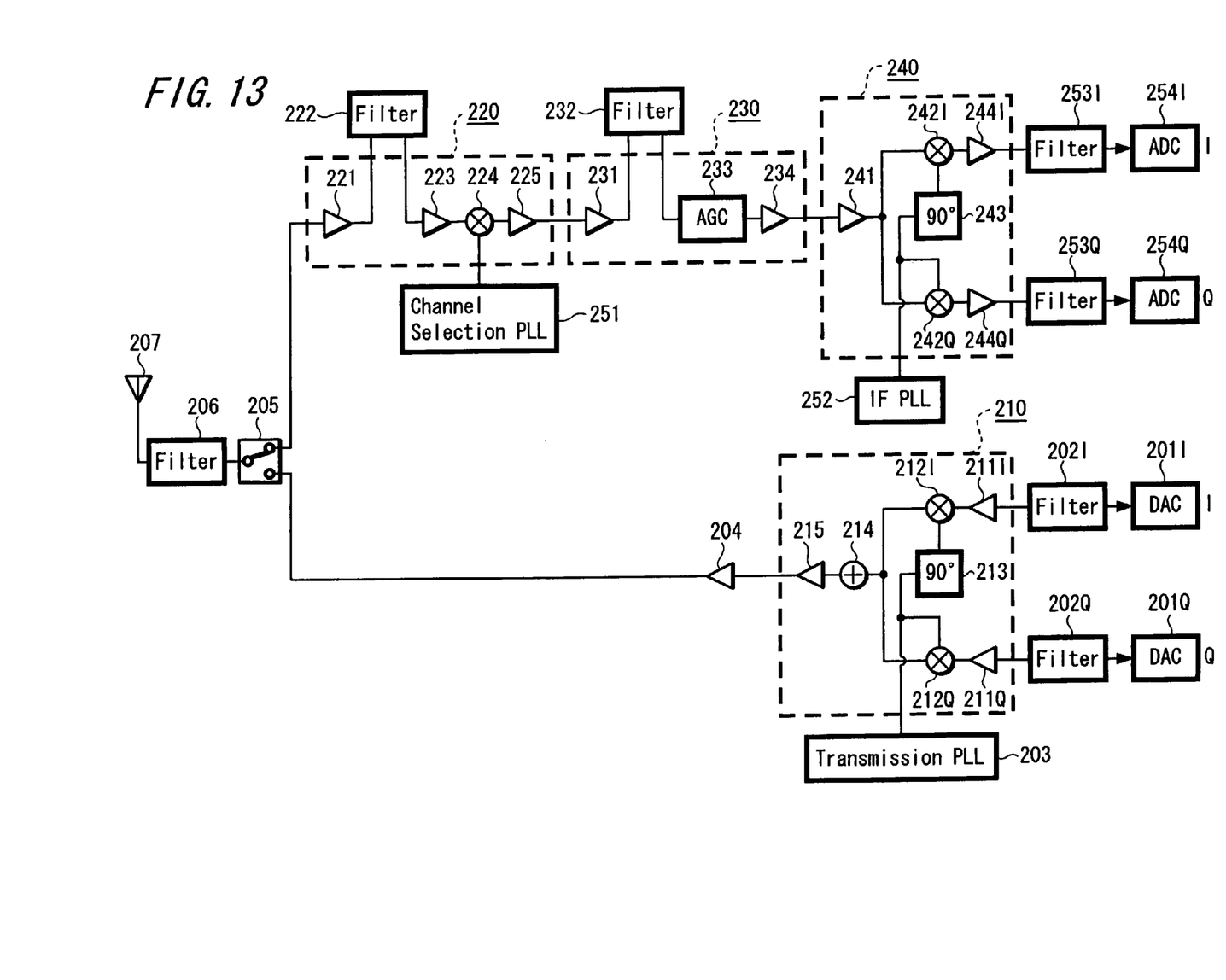
FIG. 13 is a circuit diagram showing an embodiment of a communication apparatus according to the present invention.

Next, an example of a configuration of a communication apparatus, to which the filter of the above-described embodiments of the present invention is applied, is explained by referring to FIG. 13.

First, an explanation is made regarding to a configuration of a transmission system in which transmission data of I channel and transmission data of Q channel are respectively supplied to digital/analogue converters (DAC) 201I and 201Q to be converted into analogue signals. The converted signal of each channel is supplied to band-pass filters 202I and 202Q, and outputs of the band-pass filters 202I and 202Q are supplied to a modulator 210 after a signal component other than a band of a transmission signal is removed.

In the modulator 210, a signal of each channel is supplied to mixers 212I and 212Q through buffer amplifiers 211I and 211Q, and is mixed with a frequency signal corresponding to a transmission frequency supplied from a transmission PLL (phase-locked loop) circuit 203 and is modulated, and then the both mixed signals are added in an adder 214 to be made into a transmission signal of one system. In this case, a signal phase is shifted by 90° in a phase shifter 213 with respect to the frequency signal supplied to the mixer 212I and so the signal of I channel and the signal of Q channel are orthogonally modulated.

An output of the adder 214 is supplied to a power amplifier 204 through a buffer amplifier 215, and is amplified to be predetermined transmission power. The signal amplified in the power amplifier 204 is supplied to an antenna 207 through a transmission-reception switching unit 205 and high frequency filter 206, and is transmitted wirelessly from the antenna 207. The high frequency filter 206 is a band-pass filter that removes a signal component other than that in the frequency band to transmit and receive in this communication apparatus.

As a configuration of a reception system, a signal received by the antenna 207 is supplied to a high frequency portion 220 through the high frequency filter 206 and transmission-reception switching unit 205. In the high frequency portion 220, the received signal is amplified in a low noise amplifier (LNA) 221 and after that the signal is supplied to a band-pass filter 222 in order to remove a signal component other than that in a reception frequency band, and the signal after the removal is supplied to a mixer 224 through a buffer amplifier 223. Further, a frequency signal supplied from a channel selection PLL circuit 251 is mixed to make a signal of a predetermined transmission channel into an intermediate frequency signal, and the intermediate frequency signal is supplied to an intermediate frequency circuit 230 through a buffer amplifier 225.

In the intermediate frequency circuit 230, the supplied intermediate frequency signal is supplied to a band-pass filter 232 through a buffer amplifier 231 to remove a signal component other than that in the band of the intermediate frequency signal, and the signal after this removal is supplied to an automatic gain control circuit (AGC circuit) 233 to be made into a signal of an approximately constant gain. The intermediate frequency signal whose gain is adjusted in the automatic gain control circuit 233 is supplied to a demodulator 240 through a buffer amplifier 234.

In the demodulator 240, the supplied intermediate frequency signal is supplied to mixers 242I and 242Q through a buffer amplifier 241 to be mixed with a frequency signal supplied from a intermediate frequency PLL circuit 252 and so the received signal component of I channel and signal component of Q channel are demodulated. In this case, a frequency signal whose signal phase is shifted by 90° in a phase shifter 243 is supplied to the mixer 242I for I signal and so the orthogonally modulated signal component of I channel and signal component of Q channel are demodulated.

The demodulated signals of I channel and Q channel are supplied respectively to band-pass filters 253I and 253Q through buffer amplifiers 244I and 244Q in order to remove a signal component other than the signals of I channel and Q channel, and the signals after this removal are supplied to analogue/digital converters (ADC) 254I and 254Q to be converted into digital data through sampling and so reception data of I channel and reception data of Q channel are obtained.

In the configuration as explained above, the band can be limited by applying the filter that has the configuration of the above-described embodiments to part of or all of the band-pass filters 202I, 202Q, 206, 222, 232, 253I, and 253Q, respectively.

According to the communication apparatus of the present invention, since the above-described filter whose performance is excellent is included, a highly reliable communication apparatus can be provided.

Although each filter is formed as the band-pass filter in the example of FIG. 13, the filter may be formed as a low pass filter that passes only a frequency band lower than a predetermined frequency and as a high pass filter that passes only a frequency band higher than a predetermined frequency and the filter having the above-described structure of each embodiment can be applied to those filters. In addition, although the example of FIG. 13 is a communication apparatus that performs the wireless transmission and wireless reception, the present invention can be applied to a filter in a communication apparatus that performs transmission and reception through a wired transmission path, and furthermore the filter having the configuration of the above-described embodiments can be used as a filter included in a communication apparatus that performs only transmission processing and in a communication apparatus that performs only reception processing.

DESCRIPTION OF REFERENCE NUMERALS

1—OSCILLATION ELEMENT
2—SEMICONDUCTOR SUBSTRATE
3—INSULATION FILM
4—INPUT-SIDE WIRING LAYER
11, 27, 28, 31, 32—MEMS RESONATOR
12—SUBSTRATE
14—INPUT ELECTRODE
5, 15—OUTPUT ELECTRODE
6, 16—SPACE
7, 17—OSCILLATION ELECTRODE
18—WIRING LAYER
8 [8A, 8B], 19 [19A, 19B]—SUPPORT PORTION
21—SILICON SUBSTRATE
22—SILICON OXIDE FILM
23—SILICON NITRIDE FILM
24 [24A, 24B]—SUPPORT COLUMN
25—SECOND-ORDER OSCILLATION MODE
26—THIRD-ORDER OSCILLATION MODE
41—CONDUCTIVE FILM
42—SACRIFICE LAYER

43—CONTACT HOLE
44—CONDUCTIVE FILM
45, 47—OPENING
S1—HIGH FREQUENCY SIGNAL
t1—INPUT TERMINAL
t2—OUTPUT TERMINAL
V1—DC BIAS VOLTAGE
201I, 201Q—DIGITAL/ANALOGUE CONVERTER
202I, 202Q, 211I, 211Q—BANDPASS FILTER
210—MODULATOR
212I, 212Q—MIXER
203—PLL CIRCUIT
213—PHASE SHIFTER
214—ADDER
215—BUFFER AMPLIFIER
204—POWER AMPLIFIER
205—TRANSMISSION-RECEPTION SWITCHING UNIT
206—HIGH FREQUENCY FILTER
207—ANTENNA
220—HIGH FREQUENCY PORTION
221—LOW NOISE AMPLIFIER
244I, 244Q—BUFFER AMPLIFIER
222, 232—BAND-PASS FILTER
223, 225, 231, 234—BUFFER AMPLIFIER
224—MIXER
251—CHANNEL SELECTION PLL CIRCUIT
233—AGC CIRCUIT
240—DEMODULATOR
252—INTERMEDIATE FREQUENCY PLL CIRCUIT
242I—MIXER
243—PHASE SHIFTER
253I, 253Q—BAND-PASS FILTER
254I, 254Q—ANALOGUE/DIGITAL CONVERTER

The invention claimed is:

1. A method of manufacturing a micro electro-mechanical system (MEMS) resonator, comprising the steps of:
    forming a electrode on a substrate;
    forming a layer on said substrate including said electrode;
    selectively forming an opening that reaches said substrate at a portion of said layer where a support column can be formed;
    forming a beam on said layer;
    forming inside said opening the support column integrated with said beam and said substrate; and
    removing said layer.

* * * * *